United States Patent [19]

Nakayama

[11] Patent Number: 4,520,323
[45] Date of Patent: May 28, 1985

[54] EMITTER FOLLOWER TYPE SEPP CIRCUIT

[75] Inventor: Kazuaki Nakayama, Tokyo, Japan

[73] Assignee: Pioneer Electronic Corporation, Tokyo, Japan

[21] Appl. No.: 524,174

[22] Filed: Aug. 17, 1983

[30] Foreign Application Priority Data

Aug. 20, 1982 [JP] Japan .................... 57-143388

[51] Int. Cl.³ .................................. H03F 3/26
[52] U.S. Cl. ........................................ 330/268
[58] Field of Search ............... 330/146, 267, 268, 270, 330/271, 273

[56] References Cited

U.S. PATENT DOCUMENTS 4,370,623  1/1983  Nagasawa .............. 330/270 X

FOREIGN PATENT DOCUMENTS 2905659  8/1979  Fed. Rep. of Germany .

Primary Examiner—James B. Mullins
Assistant Examiner—Steven J. Mottola
Attorney, Agent, or Firm—Sughrue, Mion, Zinn, Macpeak & Seas

[57] ABSTRACT

A SEPP class B amplifier circuit of the non-cutoff type is improved by constructing the circuit such that the idle currents from first and second amplifiers are made independent of the circuit input by providing three-terminal error amplifiers in a feedback loop which receive, as inputs, level-shifted circuit inputs and output resistance network outputs, and amplifier outputs.

5 Claims, 9 Drawing Figures

EMITTER FOLLOWER TYPE SEPP CIRCUIT

BACKGROUND OF THE INVENTION

This invention relates to an emitter follower type single-ended push pull circuit of the non-cutoff class "B" type.

Emitter follower type circuits have been generally of class "B" efficiency and are inevitably of a vertical transfer characteristic. Conventional circuits of this class have a tendency to generate switching distortion when one transistor is on the the other transistor is cut off. To eliminate this defect and to make the "B" class circuit a non-cutoff type, of late, it has been a matter of course to use a servo circuit for providing a constant idle current flowing through the transistors to thereby prevent cut-off at all times. In this manner, switching distortion may be surely remedied; however, no means has been adopted to cope with the current distortion derived from the non-linearity of the current transfer characteristic inherent in the transistor and the voltage distortion caused by an exponential transfer characteristic.

Further, an idle current involves the disadvantage of thermal runaway if temperature is not compensated in the case of a bipolar transistor. In the past, there has been no means for controlling the idle current to a constant value, so that the idle current value is consequently varied depending upon the presence of a signal or the extent of the ambient temperature. This is not desirable since the operation point may be changed for a given time duration irrespective of the presence of the signal.

In addition, since such temperature compensation is very severe and, specifically, since the conventional circuit of the non-cutoff class "B" type makes use of positive feedback, the instability of the idle current is enhanced. It is very difficult to design a circuit capable of performing complete temperature compensation simultaneously with other design requirements.

FIG. 1 shows the basic structure of the conventional single-ended push pull circuit (hereinafter referred to as a "SEPP" circuit) of the non-cutoff class "B" type, in which letters $A_1$ and $A_2$ designate error amplifiers, each of which has a gain of 1 or less. Letters $B_1$, $B_2$ designate voltage generator circuits, that is, voltage summing devices, and C indicates an input signal source, $V_B$ being a bias current source for transistors $Q_1$ and $Q_2$.

In FIG. 1, designated by $iE_1$ and $iE_2$ are idle currents $I_d$ when there is no current at the input IN. $I_{B1}$ and $I_{B2}$ are supplied from a power source $V_B$. Now, if the base emitter voltage is denoted as $V_{BE}$, and the emitter resistance is expressed by $R_E$, the following equation will hold.

$$I_d = \frac{V_B - V_{BE}}{R_E} \quad (1)$$

An input signal current $i_i$ flows to increase $i_{E1}$, whereupon the current-amplification factor of a transistor $Q_1$ is expressed by $h_{fe1}$ to obtain the following equation.

$$i_{E1} = h_{fe1} \cdot i_i$$

Current $i_{E1}$ allows resistance $R_E$ to have a voltage generated across opposite ends thereof, whereby the input voltage $V_{i1}$ of amplifier $A_1$ may be expressed as follows:

$$V_{i1} = (V_{BE} - V_B) + i_{E1}R_E = (V_{BE} - V_B) + h_{fe1} \cdot i_i R_E$$

This voltage, when no amplifier $A_1$ is provided, allows transistor $Q_2$ to be reversely biased and cut off. In contrast, the gain of the amplifier $A_1$ is set at 1, and the voltage $V_{i1}$ intact is positively fedback to the base of the transistor $Q_1$ to thereby always admit of a constant flow of idling current $I_d$. Even if the input signal current $i_i$ is inverted allowing the transistor $Q_2$ to be turned "on", entirely the same actions are performed to establish the SEPP circuit without cutting off the transistor $Q_1$.

FIG. 2 is a representation explanatory of the current transfer characteristic in response to the input signal current $i_i$ in the circuit shown in FIG. 1. In general, the transistor tends to rapidly lower the current-amplification factor $h_{fe}$ when its emitter current is increased, to render its resultant characteristic considerably non-linear as shown, thus generating current distortion. As afore-mentioned, when the gain of the amplifiers $A_1$ and $A_2$ is set at 1, the positive feedback ratio becomes 100% of the idle current $I_d$, causing the effect of the resistor $R_E$, i.e., stabilization to be completely lost. That is, $R_E$ in equation (1) can be considered as zero. Accordingly, the idle current $I_d$ is not stabilized, to cause oscillation. In practice, the gain of the amplifiers $A_1$ and $A_2$ is less than 1, however, the idle current is nonetheless rendered extremely unstable.

When the circuit is not constituted so as to be of the non-cutoff class "B" type and is of a constant voltage drive to eliminate only distortions caused from the current transfer characteristics thereof, i.e., when the amplifiers $A_1$ and $A_2$ in FIG. 1 are eliminated and a constant voltage source is employed as an input signal source C, the transfer characteristic is as shown in FIG. 3. Even, under such circumstances, distortion caused by the exponential transfer characteristic of the transistor is still existent.

In the conventional SEPP circuit of the class "B" type to which a constant voltage drive method is applied, (1) distortion derived from an exponential and functional transfer characteristic and switching distortion caused by the on-off action of an output transistor are generated. Even if the SEPP circuit of the non-cutoff class "B" type relies on a constant-current drive method, (2) the occurrence of distortion due to the current transfer characteristic has been unavoidable. Irrespective of the drive method, (3) temperature compensation for the idle current is required, however, it is impossible to completely effect temperature compensation. (4) It takes as much as several tens of minutes or more from the time when the power source turns on until the idle current is constant. (5) The idle current fluctuates according to the presence of a signal, and the magnitude of the idle current after a large signal is applied greatly departs from the set point. (6) The performance points are unstable because of reasons (3), (4), and (5), that is, they are variable according to the ambient temperature and the presence or absence of a signal.

SUMMARY OF THE INVENTION

It is an object of the present invention to provide an emitter follower type SEPP circuit of the non-cutoff class "B" type which is capable of obviating the aforementioned shortcomings and of greatly minimizing distortion, but which requires no temperature compensation for the idle current.

DETAILED DESCRIPTION OF THE PREFERRED EMBODIMENTS

Figure 1:
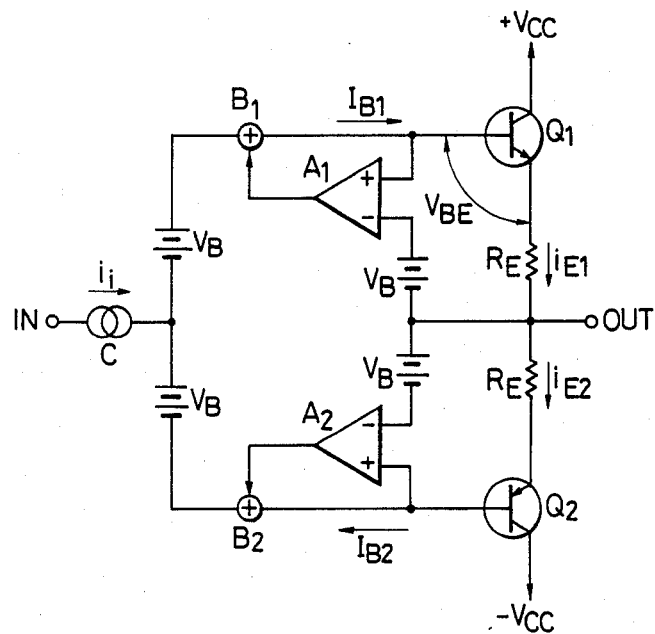
FIG. 1 is a circuit diagram showing one form of a conventional circuit.
Figure 2:
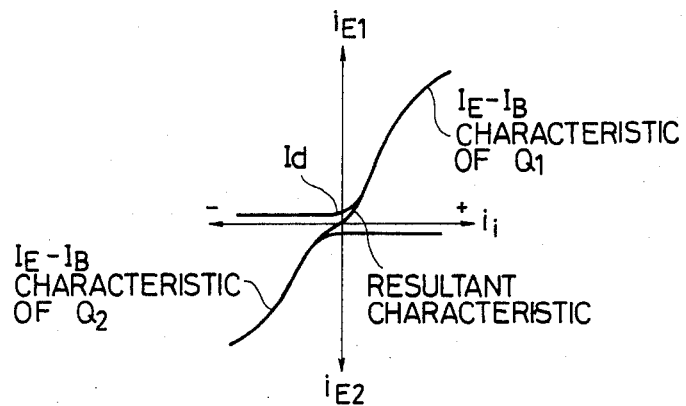
FIG. 2 is a graph showing a characteristic of the circuit shown in FIG. 1.
Figure 3:
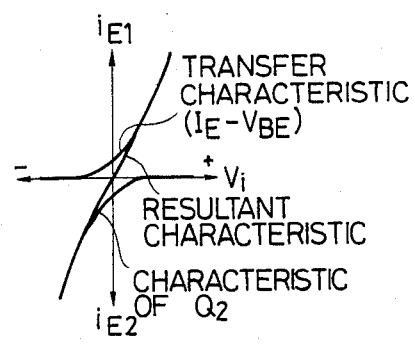
FIG. 3 is a graph of one example of a characteristic of a conventional circuit.

The invention will now be described with reference to FIG. 4 et seq. wherein like reference numerals designate like or corresponding parts in FIG. 1.

Figure 4:
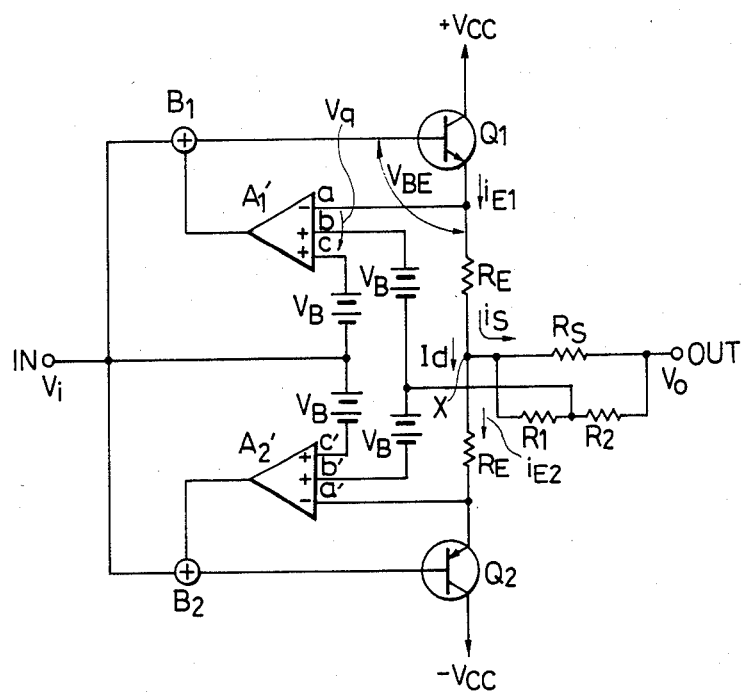
FIG. 4 is a circuit diagram showing the basic circuit according to the present invention.

FIG. 4 shows the basic structure of the SEPP circuit according to the present invention, which is provided with amplifiers $A'_1$ and $A'_2$ as error amplifiers, each having three input terminals a–c, and a′–c′. Emitters of output transistors $Q_1$ and $Q_2$ are connected with one another by resistors $R_E$. The connecting point therebetween is connected by resistor $R_S$ to the output end OUT. The emitters of transistors $Q_1$ and $Q_2$ are connected to input terminals a, a′ of the error amplifiers $A'_1$ and $A'_2$. An input end IN is connected to the input terminals c and c′ via bias sources $V_B$. A divider circuit, which consists of a series circuit of resistors $R_1$ and $R_2$ for detecting a signal output current, is connected in parallel with the resistor $R_S$. The connecting point of the resistors $R_1$ and $R_2$ is connected via bias sources $V_B$ with input terminals b and b′. The outputs of the amplifiers $A'_1$ and $A'_2$ are applied to voltage generation circuits $B_1$ and $B_2$ each comprising a voltage summing device and is thereupon added to the input signal.

The amplifier $A'_1$ renders the input terminal b open, that is, makes the impedance imposed on the terminal by the amplifier essentially infinite so that the signal on the terminal b has no effect on the amplifier output, when a negative signal is applied to the terminal b with respect to the signal on the input terminals a or c. The amplifier $A'_1$ renders the input terminal c open when a negative signal is applied to the terminal c with respect to the signal on the input terminal b or a. The amplifier $A'_2$ renders the input terminal b′ open when a positive signal is applied to the terminal b′ with respect to the signal on the input-terminals a′ or c′, and the amplifier $A'_2$ renders the input terminal c′ open when a positive signal is applied to the terminal c′ with respect to the signal on the input terminals b′ or a′.

With the aforementioned arrangement, a feedback loop is formed using the input terminals c, c′ of the amplifiers $A'_1$, $A'_2$ as the signal input terminals and the input terminals a, a′ as the feedback input terminals, so that an idle current Id being free from an input signal is established by the following equation.

$$I_d = \frac{V_B}{R_E} \quad (2)$$

Next, the input terminal b when the positive signal is applied thereto, is opened as the negative signal equal to $i_s R_E$ is forcibly added to the input terminals a and c. So, if the gain of the amplifier $A'_1$ is set at $\alpha$, the input voltage $V_i$ may be expressed by the following equation.

$$V_i = V_O + \Delta V_{BE} + i_s(R_E + R_S) - \alpha V_g \quad (3)$$

wherein $V_O$=output voltage, $\Delta V_{BE}$=the variation in $V_{BE}$, $i_s$=signal current, and wherein $V_g$ is the input voltage between terminals a–c, and may be expressed by the following equation.

$$V_g = V_i - \{V_O + i_s(R_E + R_S)\} \quad (4)$$

By substituting equation (4) into equation (3), the following equation may be obtained.

$$V_i = V_O + \Delta V_{BE} + i_s(R_E + R_S) - \\ \alpha[V_i - \{V_O + i_s(R_E + R_S)\}] = \\ V_O + \Delta V_{BE} + i_s(R_E + R_S) - \\ \alpha V_i + \alpha V_O + \alpha i_s(R_E + R_S)$$

This equation may be expressed in terms of $V_O$ as follows:

$$V_O = V_i - i_s(R_E + R_S) - \frac{\Delta V_{RE}}{1 + \alpha} \quad (5)$$

where the value $\alpha$ is great so that the effect of $\Delta V_{BE}$, the term representing the generation of distortion derived from an exponential and functional transfer characteristic becomes very small. Consequently, a load even if linearly applied produces no distortion in $i_s$ so that $V_i$ and $V_O$ are similar to one another to eliminate distortion. This results from the use of the error amplifier which compares the input with the output for amplification.

On the other hand, taking actuation of the amplifier $A'_2$ into account, the input terminal c′ is rendered open because a positive signal, which is higher than the voltage at the input terminals b′ and a′ by approximately $(R_E i_s + V_g)$ in forcibly applied thereto. The amplifier $A'_2$ is therefore reduced to an error amplifier which employs terminals b′ and a′ as the inputs, whereby the idle current may be expressed by the following equation.

$$I_d = \frac{V_B}{R_E},$$

the idle current is thus controlled to the value equal to that of equation (2).

Where a negative signal is applied to the input end IN, the same operation is performed, and may be described by simply replacing the reference legends above.

Figure 5:
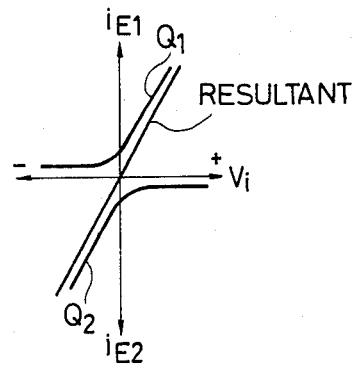
FIG. 5 is a graph showing a characteristic of the circuit shown in FIG. 4.

The circuit shown in FIG. 4 is constructed to provide a transfer characteristic in the manner shown in FIG. 5, and is of the SEPP non-cutoff class "B" type having a resultant characteristic of linear form.

Figure 6:
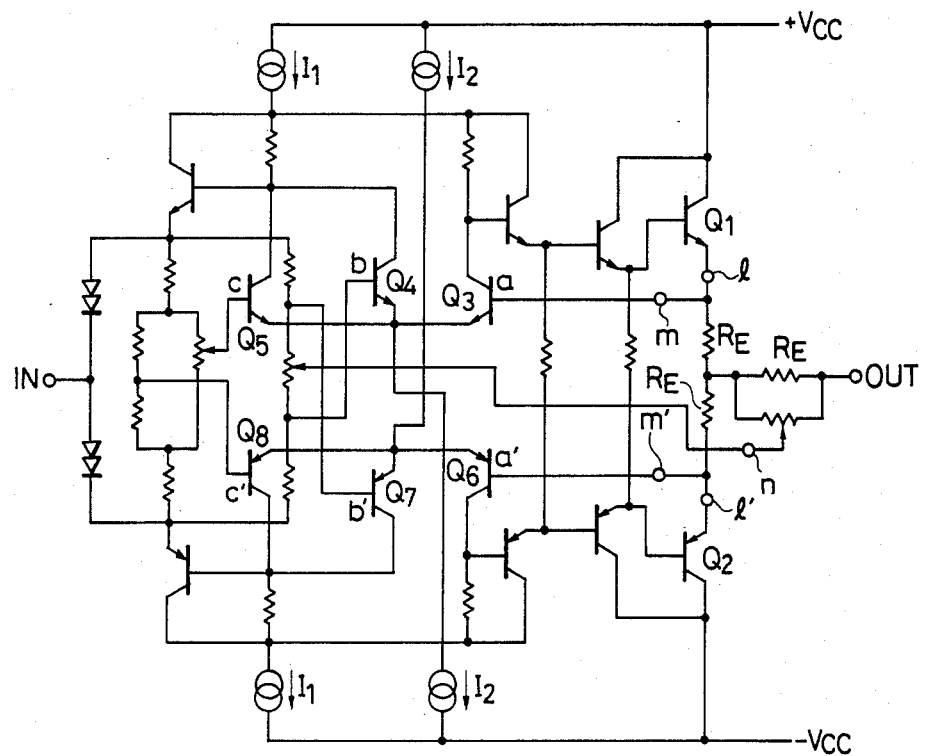
FIG. 6 is a circuit diagram showing one example of a circuit in which the basic circuit of FIG. 4 is embodied.

FIG. 6 is a diagram of a circuit in which the circuit in FIG. 4 is embodied and in which the error amplifier $A'_1$ is formed by the transistors $Q_3$–$Q_{5'}$ the bases of these transistors $Q_3$–$Q_5$ serving as the input terminals a–c. On the other hand, the error amplifier $A'_2$ is defined by the transistors $Q_6$–$Q_8$ with the bases of these transistors $Q_6$–$Q_8$ serving as the input terminals a'–c'. $I_1$ and $I_2$ designate constant-current sources and establish a relation of $I_1 > I_2$ therebetween.

Figure 7:
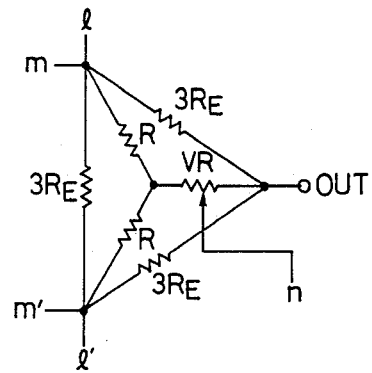
FIGS. 7 and 8 are circuit diagrams showing modifications of a part of the circuit shown in FIG. 6.

The output resistance circuit in FIG. 6 may be converted to the Y-Δ configuration, thereby obtaining a circuit as shown in FIG. 7. This output resistance circuit if bridge detected would produce a circuit configuration as shown in FIG. 8.

Figure 8:
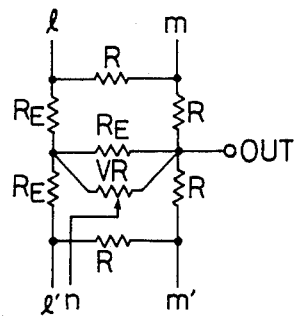

The circuit shown in FIG. 8 as subjected to bridge detection may be the same as the circuit in FIG. 4 arranged so that the input terminals a, a' of the error amplifier A', and $A'_2$ are equivalently connected to a point X to eliminate distortion derived from an unbalance due to vertical dispersion of the emitter resistor $R_E$. In this instance, the output $V_O$ may be expressed, as an alternative to equation (5), as follows:

$$V_O = V_i - i_s R_S - \frac{\Delta V_{BE} + i_s R_E}{1 + \alpha} \tag{5'}$$

It is apparent from this equation that if α is sufficiently great, $R_E$ may be eliminated.

Figure 9:
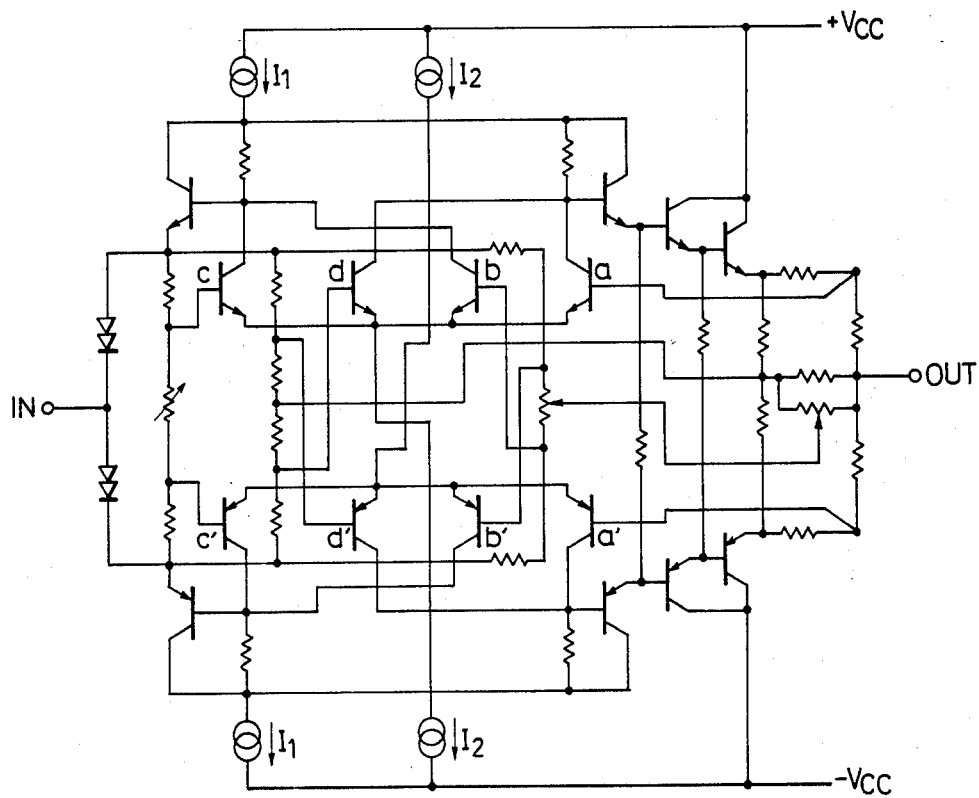
FIG. 9 is a circuit diagram showing another embodiment of the present invention.

FIG. 9 is a circuit diagram showing an example wherein ideal amplification is made by holding the error amplifier section in balance.

In either case as above set forth, the bias applied between the terminals c–c' and b–b' or d–d' may be selected to obtain any value at which a predetermined idle current is obtained, but not restricted by the value $V_B$ in FIG. 4.

Either of the circuits shown in FIG. 6 and FIG. 9 may be of the type of SEPP device which is stabilized by a servo circuit and operates as non-cutoff class "B" device even if the constant-voltage drive point which is the input end is open and $I_1$ is changed to the input signal source, that is, a constant-current driving circuit. Incidentally, the first and second amplifier elements may of course be fabricated in a Darlington arrangement.

As stated hereinbefore, according to the present invention, a SEPP circuit of the class "B" type is designed so that the idle current and distortion component are simultaneously real-time detected and fed back by error amplification.

For the reasons above set forth, the distortion at the SEPP output end may be greatly minimized and temperature compensation for the idle current is eliminated while rendering the idle current stable and constant immediately after connecting the power source. The idle current may be stabilized at a set value immediately after the application of a large signal. Further, the output impedance is greatly reduced, so that the signal involves less effect on the preceding stage. With this arrangement, a SEPP circuit may be obtained which is highly efficient, stable and which has less distortion, and which is of the non-cutoff class "B" type having no switching distortion.

What is claimed is:

1. An emitter follower type SEPP current, comprising: first and second amplifier elements each configured in the emitter follower SEPP class "B" form; first and second error amplifiers provided corresponding to said first and second amplifiers and each having at least three input terminals; a first of the input terminals of said first and second error amplifiers is connected to a signal detector terminal for detecting a signal output current of a resistance network, a second of the input terminals of said first and second error amplifiers is connected to an input signal, and a third of the input terminals of said first and second error amplifiers is connected to an emitter of said output transistors; first and second voltage generator means incorporated between a circuit input and input terminals of said first and second amplifier elements for generating a voltage with the outputs of said corresponding error amplifier; and said resistance network including first and second idle detector terminals incorporated between output electrodes of said first and second amplifier elements and a circuit output end for detecting idle currents from said first and second amplifier elements, said error amplifiers being arranged in a feedback loop such that idle currents are made independent of the input signals applied to said circuit.

2. A device as claimed in claim 1, said SEPP circuit being arranged such that an error voltage between two voltages level-shifted at a predetermined value between the voltage of said first idle detector terminal and a voltage of said circuit input end, is amplified by said first error amplifier whereas an error voltage between two voltages level-shifted at a predetermined value between the voltage of said second idle detector terminal and a voltage of said circuit input end, is amplified by said second error amplifier.

3. A device as claimed in claim 2, wherein said second error amplifier being actuated as an error amplifier as a function of the error voltage level-shifted between the voltage of said second idle detector terminal and the voltage of said signal detector terminal when said first error amplifier is actuated as an error amplifier as to the error voltage level-shifted between the voltage of said first idle detector terminal and the voltage of said circuit input end, and said first error amplifier being actuated as an error amplifier as to the error voltage level-shifted between the voltage of said first idle detector terminal and the voltage of said signal detector terminal when said second error amplifier is actuated as an error amplifier as to the error voltage level-shifted between the voltage of said second idle detector terminal and the voltage of said circuit input end.

4. A device as claimed in claim 1, wherein said voltage generator means, each comprise summing means receiving a circuit input signal and an error amplifier output.

5. A device as claimed in claim 1, wherein said error amplifiers each receive, as inputs, outputs from said corresponding amplifier elements, level-shifted circuit inputs and a level-shifted output of said resistance network.

* * * * *